(12) United States Patent
Lattard et al.

(10) Patent No.: US 10,777,537 B2
(45) Date of Patent: Sep. 15, 2020

(54) FACE-TO-FACE THREE-DIMENSIONAL INTEGRATED CIRCUIT OF SIMPLIFIED STRUCTURE

(71) Applicant: Commissariat a l'energie atomique et aux energies alternatives, Paris (FR)

(72) Inventors: Didier Lattard, Grenoble (FR); Sebastien Thuries, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/268,764

(22) Filed: Feb. 6, 2019

(65) Prior Publication Data

US 2019/0252353 A1 Aug. 15, 2019

(30) Foreign Application Priority Data

Feb. 14, 2018 (FR) ...................... 18 51255

(51) Int. Cl.
*H01L 23/52* (2006.01)
*H01L 23/49* (2006.01)
(Continued)

(52) U.S. Cl.
CPC .... *H01L 25/0657* (2013.01); *H01L 23/49827* (2013.01); *H01L 23/5286* (2013.01); *H01L 24/08* (2013.01); *H01L 24/80* (2013.01); *H01L 25/18* (2013.01); *H01L 25/50* (2013.01); *H01L 2224/16145* (2013.01); *H01L 2224/8012* (2013.01); *H01L 2224/80894* (2013.01); *H01L 2225/0651* (2013.01); *H01L 2225/06517* (2013.01); *H01L 2225/06524* (2013.01);
(Continued)

(58) Field of Classification Search
CPC .......... H01L 25/0657; H01L 23/49827; H01L 23/5286
USPC ........................................................ 257/777
See application file for complete search history.

(56) References Cited

U.S. PATENT DOCUMENTS

| | | | |
|---|---|---|---|
| 2007/0001298 A1* | 1/2007 | Ozawa | H01L 24/49 257/723 |
| 2007/0102820 A1* | 5/2007 | Kimura | H01L 23/5223 257/758 |

(Continued)

FOREIGN PATENT DOCUMENTS

| | | |
|---|---|---|
| JP | 2004-158524 | 6/2004 |
| WO | WO 2016/176046 A1 | 11/2016 |

OTHER PUBLICATIONS

French Preliminary Search Report dated Oct. 18, 2018 in French Application 18 51255, filed on Feb. 14, 2018 (with English Translation of Categories of Cited Documents & Written Opinion).
(Continued)

*Primary Examiner* — Sheikh Maruf
(74) *Attorney, Agent, or Firm* — Oblon, McClelland, Maier & Neustadt, L.L.P.

(57) ABSTRACT

An integrated circuit including a first chip including a stack of a substrate, of an active layer and of interconnect layers; a second chip including a stack of a substrate, of an active layer and of interconnect layers; an interconnect network for interconnecting the first and second chips. The interconnect layer of the highest metallization level of the first chip includes a power distribution network; the interconnect layer of the highest metallization level of the second chip is without a power distribution network.

12 Claims, 4 Drawing Sheets

(51) Int. Cl.
*H01L 25/065* (2006.01)
*H01L 25/18* (2006.01)
*H01L 25/00* (2006.01)
*H01L 23/00* (2006.01)
*H01L 23/498* (2006.01)
*H01L 23/528* (2006.01)

(52) U.S. Cl.
CPC ............ *H01L 2225/06541* (2013.01); *H01L 2225/06586* (2013.01); *H01L 2225/06589* (2013.01)

(56) References Cited

U.S. PATENT DOCUMENTS

| | | | | |
|---|---|---|---|---|
| 2009/0020850 | A1* | 1/2009 | Orita | H01L 23/5223 257/532 |
| 2009/0237902 | A1* | 9/2009 | Kouya | H05K 1/0231 361/777 |
| 2010/0164084 | A1* | 7/2010 | Lee | H01G 4/33 257/686 |
| 2011/0042795 | A1* | 2/2011 | Knickerbocker | H01L 21/486 257/686 |
| 2011/0057320 | A1* | 3/2011 | Fujiyama | H01L 23/5286 257/773 |
| 2012/0025388 | A1* | 2/2012 | Law | H01L 25/0657 257/773 |
| 2012/0038057 | A1* | 2/2012 | Bartley | H01L 23/3677 257/774 |
| 2012/0306101 | A1* | 12/2012 | Tamaru | H01L 27/11898 257/774 |
| 2012/0327583 | A1* | 12/2012 | Ayers | H05K 1/0298 361/679.31 |
| 2014/0151882 | A1* | 6/2014 | Morimoto | H01L 28/88 257/739 |
| 2014/0159041 | A1* | 6/2014 | Yamaoka | H01L 22/30 257/48 |
| 2014/0264862 | A1* | 9/2014 | Tsai | H01L 27/14621 257/741 |
| 2015/0059362 | A1* | 3/2015 | Chou | H01L 23/38 62/3.7 |
| 2016/0322331 | A1* | 11/2016 | Lim | H01L 24/11 |
| 2019/0259702 | A1* | 8/2019 | Jain | H01L 23/481 |

OTHER PUBLICATIONS

Billoint, O., et al. "A Comprehensive Study of Monolithic 3D Cell on Cell Design Using Commercial 2D Tool", 2015 Design, Automation & Test in Europe Conference & Exhibition (DATE), EDAA, 2015, pp. 1192-1196.

\* cited by examiner

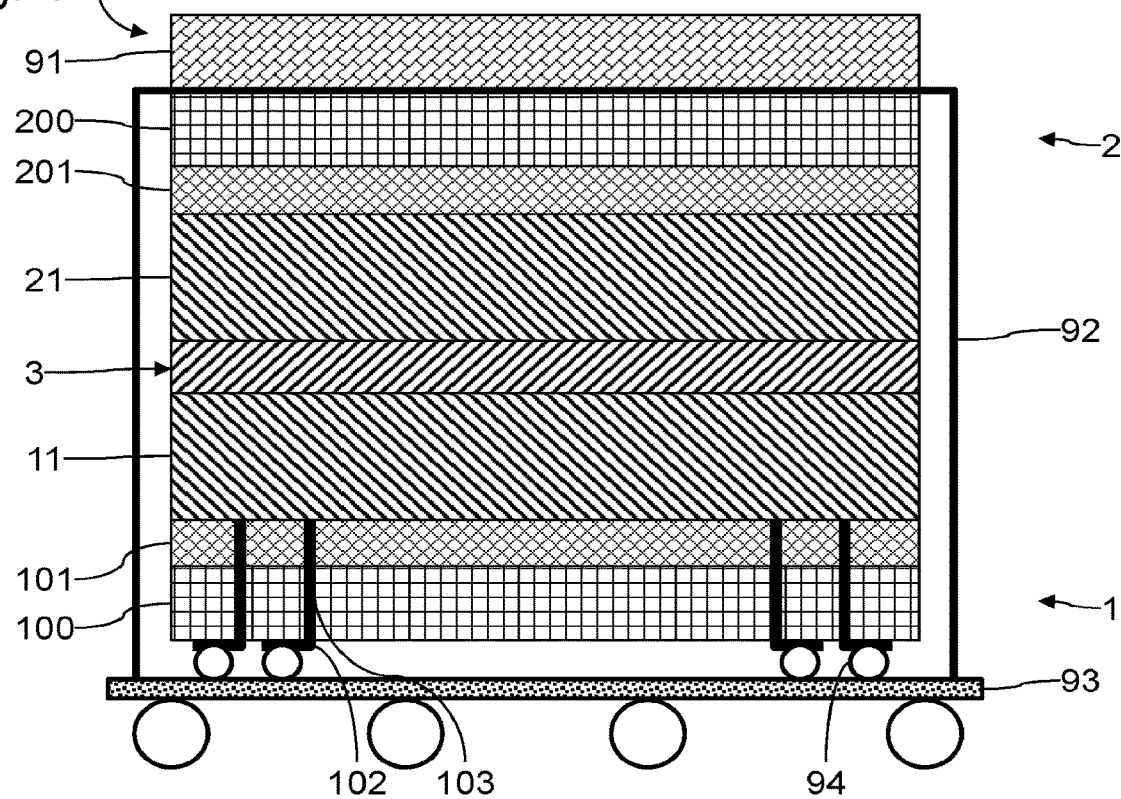

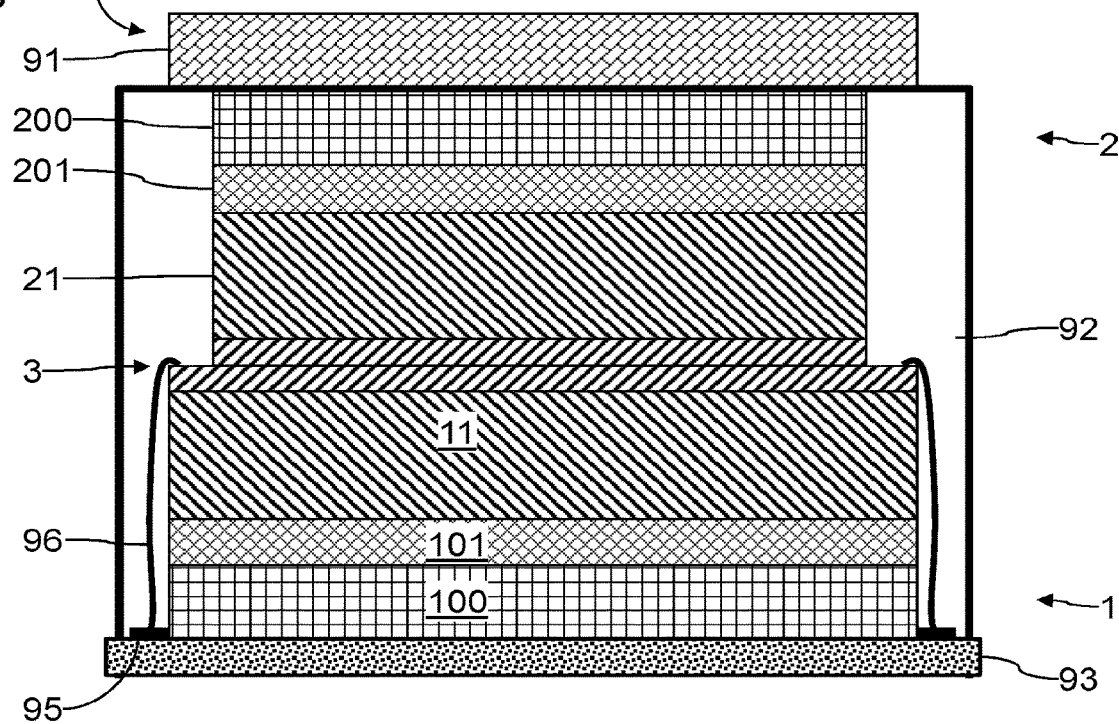
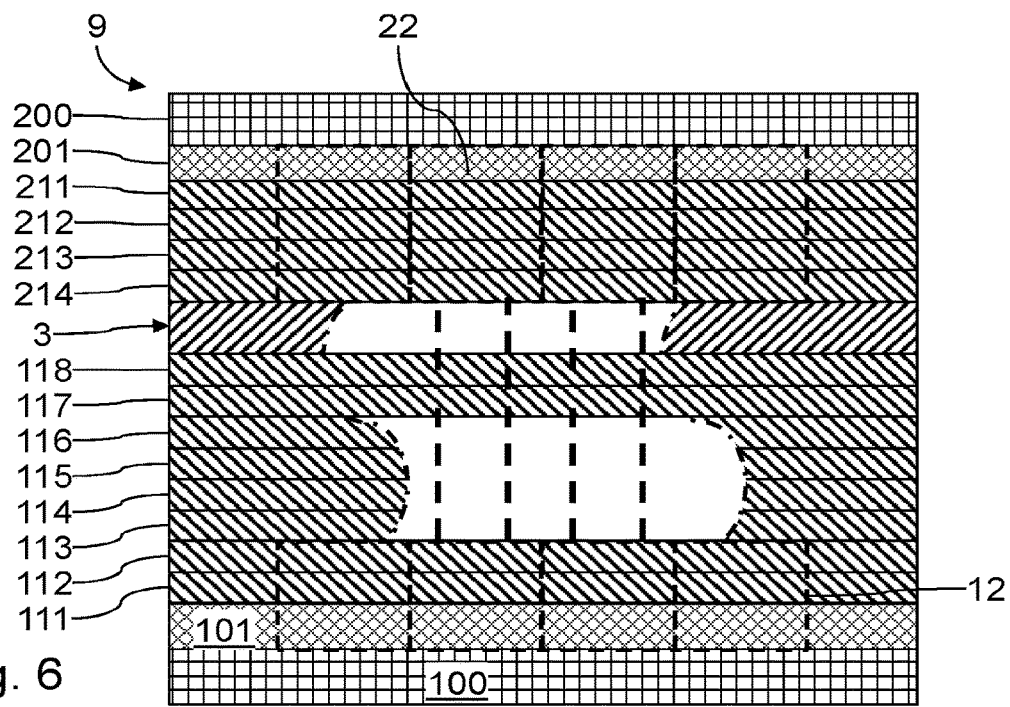

FACE-TO-FACE THREE-DIMENSIONAL INTEGRATED CIRCUIT OF SIMPLIFIED STRUCTURE

The invention relates to integrated circuits comprising a plurality of active layers of electronic components, termed 3D integrated circuits, and in particular to such integrated circuits combining chips obtained by means of different fabrication processes implemented in parallel. Different fabrication processes are generally used in order to adapt each chip for the functions it implements.

According to one known configuration, two different types of chips are joined together in a face-to-face configuration, i.e. with their substrates opposite one another and with these two chips being joined together by securely connecting their interconnect layers or metallization layers.

The two different types of chips are designed independently. The design process for each chip corresponds to a conventional design process for chips that are intended to be conditioned independently. The design process also includes a study of the compatibility of the interfaces between the two types of chips.

Each chip comprises a power distribution network specific thereto for supplying electrical power to this chip, corresponding to one or more of its interconnect layers of the highest metallization level. Specifically, these interconnect layers have the widest electrical lines and are therefore suitable for distributing the power supply of the chip. The power distribution networks are designed according to a conventional design process for two-dimensional circuits.

One process envisaged using a technology from the company STMicroelectronics for a 28 nm node thus provides a 3D integrated circuit structure including two chips that are joined together in face-to-face configuration. Each chip includes a substrate and an active layer formed on the substrate. Each active layer is surmounted by 10 metal levels of interconnect layers. The last two metal levels of the interconnect layers are power supply grids having pitches that are one and the same multiple of the technology node, for example 8×. These last two metal levels distribute the supply voltages to the lower metal levels. A 3D interconnect layer connects the power supply grids of the two chips.

The invention aims to overcome one or more of these drawbacks. The invention thus relates to an integrated circuit such as defined in the appended claims.

Other features and advantages of the invention will become clearly apparent from the description thereof that is provided below by way of completely nonlimiting indication with reference to the appended drawings, in which:

FIG. 4 is a schematic sectional view of one example of a conditioned three-dimensional integrated circuit according to one variant of the invention;

FIG. 5 is a schematic sectional view of one example of a conditioned three-dimensional integrated circuit according to another variant of the invention;

FIG. 6 is a schematic sectional view of one example of an interconnect configuration for a three-dimensional circuit according to the invention.

The invention proposes sharing a power distribution network between two chips that are positioned face-to-face in a three-dimensional integrated circuit.

Figure 1:
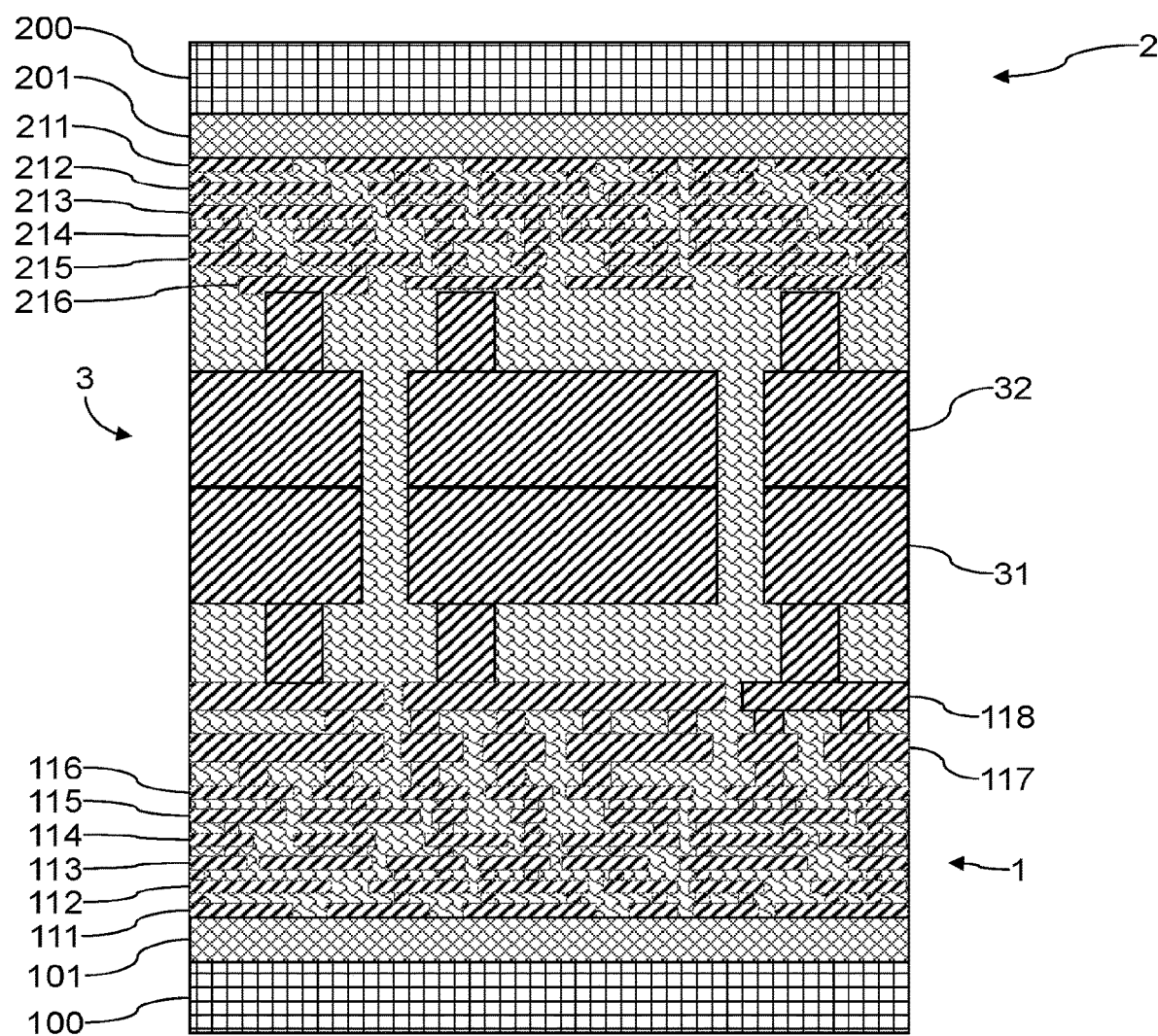
FIG. 1 is a schematic sectional view of a three-dimensional integrated circuit according to one example of an embodiment of the invention.

FIG. 1 is a schematic sectional view of a three-dimensional integrated circuit 9 according to one example of an embodiment of the invention. The three-dimensional integrated circuit 9 includes a chip 1 and a chip 2, which are positioned face-to-face. The highest level metallization layers of the chip 1 and of the chip 2 thus face one another. The integrated circuit 9 includes a three-dimensional interconnect network 3, which is intended to electrically interconnect the chips 1 and 2. Processes for securely connecting the chips 1 and 2 are known per se, for example bonding. In particular, the document "Hybrid bonding toolbox for 3D images", published as part of the European 3D Summit 2017 conference held in Grenoble from the 23 to 25 Jan. 2017, discloses processes for joining chips together in order to form hybrid three-dimensional integrated circuits.

The network 3 here takes the form of metallization layers 31 and 32 that are arranged between the chip 1 and the chip 2. The metallization layer 31 is here a layer belonging initially to the chip 1 and may be identified as a hybrid connection layer. The metallization layer 32 is here a layer belonging initially to the chip 2 and may be identified as a hybrid connection layer. The hybrid connection or the interface between the hybrid connection layer 31 and the hybrid connection layer 32 may be differentiated in practice when cutting through the three-dimensional integrated circuit 9 by an imperfect alignment between the connected metal portions of the layers 31 and 32, as well as an imperfect alignment between the connected portions made of dielectric material of the layers 31 and 32.

A hybrid connection between the hybrid connection layers 31 and 32 may also be identified by the presence of microvoids or defects at the level of their connection interface.

The chip 1 includes, in a manner known per se, the superposition:
of a substrate 100;
of an active layer 101;
of the interconnect layers or metallization layers 111 to 118.

The metallization layers 111 to 116 have a given etch pitch. The metallization layers 117 and 118 have an etch pitch that is twice that of the metallization layers 111 to 116.

The chip 2 includes, in a manner known per se, the superposition:
of a substrate 200;
of an active layer 201;
of the interconnect layers or metallization layers 211 to 216.

The metallization layers 211 to 216 here have an etch pitch that is identical to that of the metallization layers 111 to 116.

In a manner known per se, for a given metallization layer, one portion includes metal lines separated by dielectric. Another portion includes dielectric, through which metal vias for connection to an adjacent metallization layer pass.

The layers 117 and 118 include a power distribution network. The layers 117 and 118 form a common power distribution network for the chips 1 and 2. The chip 2 is thus without a power distribution network in its highest level metallization layers. The layers 215 and 216 may thus be dedicated to routing logic signals. The chip 2 may however be provided with a power distribution network in metallization layers of lower level than the layers 215 and 216, for example for standard cells and SRAM blocks. The connections for supplying power to the active components of the chips 1 and 2 are made in a manner known per se through the metallization layers. The layers 117 and 118 may be connected to a power distribution grid of an intermediate metal level, with a view to limiting local voltage drops.

The layers 117 and 118 are connected to the metallization layers 215 and 216 via the interconnect network 3. The interconnect network 3 comprises the layer 31 in contact with the layer 118, and the layer 32 in contact with the metallization layer 216.

The power distribution network of the layers 117 and 118 is sized so as to supply power satisfactorily to the chips 1 and 2 or portions thereof having identical voltage specifications.

The power supplies to which the power distribution network is connected may be generated inside or outside the stack of the chips 1 and 2. The sizing of the power distribution network is defined so as to ensure that the active components operate properly and to ensure a sufficient amplitude of current peaks during dynamic phases (startup, stopping, change of operating mode, activity during operations and processed data, etc.).

In the example illustrated in FIG. 1, the highest metallization level of the chip 1 has an etch pitch that is at least twice that of the highest metallization level of the chip 2 (without taking the etch pitches of the layers 31 and 32 into account). The process for fabricating the chip 2 is therefore simplified, thereby allowing the cost of the fabrication process to be decreased. The invention has proven to be particularly advantageous in the case of integrated circuits occupying substantial substrate areas (for example several $cm^2$). For such circuits, the invention affords gains in terms of fabrication efficiency and of lowering fabrication costs that are particularly advantageous.

It is also possible to envisage producing a chip 2 having a highest metallization level having an etch pitch that is equal to that of the highest metallization level of the chip 1. This highest metallization level of the chip 2 may then include additional routing functions with respect to a chip of the prior art used in a three-dimensional integrated circuit. The chips 1 and 2 may for example be of the 28 nm technology node type (or for example be chosen from the following technology nodes: 65 nm, 40 nm, 32 nm, 28 nm, 22 nm, 20 nm, 14 nm, 10 nm and 7 nm). The chip 1 may for example be dedicated to logic gates, while the chip 2 may be dedicated to memory cells.

Figure 2:
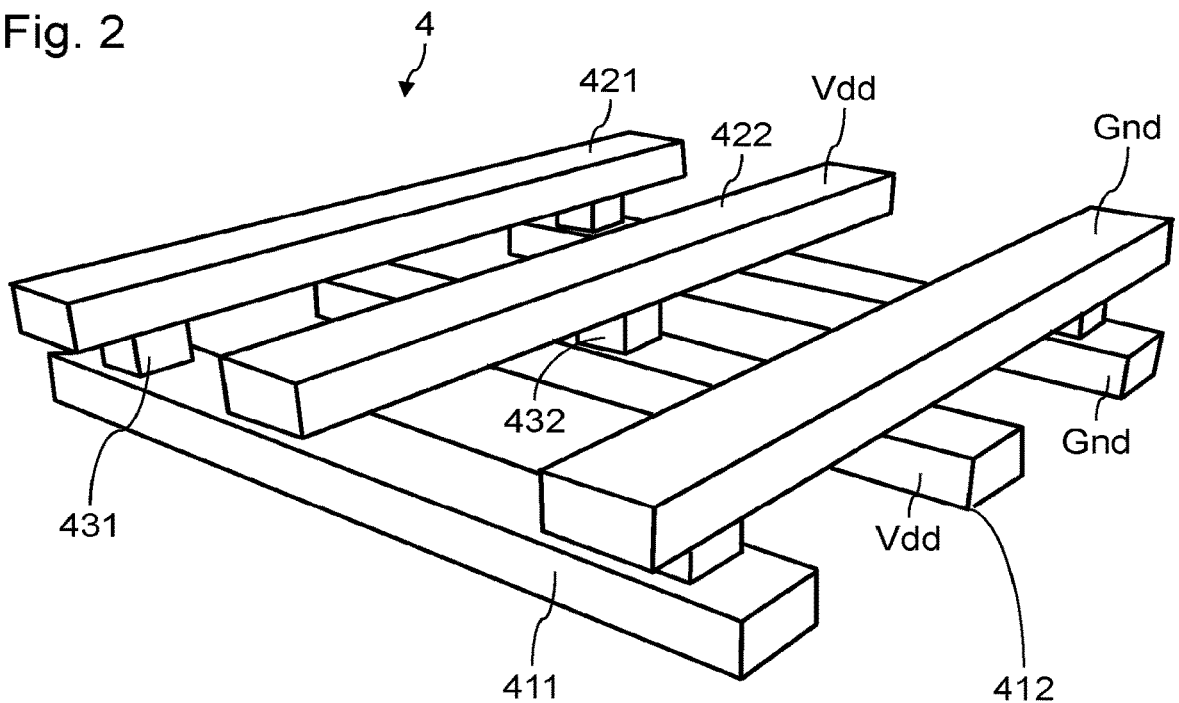
FIG. 2 is a perspective view of one example of a power distribution network configuration that may be implemented.

FIG. 2 is a perspective view schematically illustrating a first example of an electrical power distribution network 4, which may be incorporated within the highest metallization levels of the chip 1. The network 4 is here intended to apply two different supply potentials, Gnd and Vdd. However, it is also possible to envisage a network 4 that is configured to apply a greater number of supply potentials.

The power distribution network 4 includes two superposed metallization levels. A first metallization level of the network 4 includes parallel power distribution rails or conductive lines 411 and 412. This metallization level of the network 4 includes an alternation of lines 411 and 412, which are electrically isolated from one another. The lines 411 and 412 are biased to Gnd and to Vdd, respectively. A second metallization level of the network 4 includes parallel power distribution rails or conductive lines 421 and 422. The lines 421 and 422 are oriented perpendicularly to the lines 411 and 412. This metallization level of the network 4 includes an alternation of lines 421 and 422, which are electrically isolated from one another. The lines 421 are electrically isolated from the lines 412 and the lines 422 are electrically isolated from the lines 411. The lines 421 and 422 are biased to Gnd and to Vdd, respectively. The lines 411 are electrically connected to the lines 421 by vias 431. The lines 412 are electrically connected to the lines 422 by vias 432.

Figure 3:
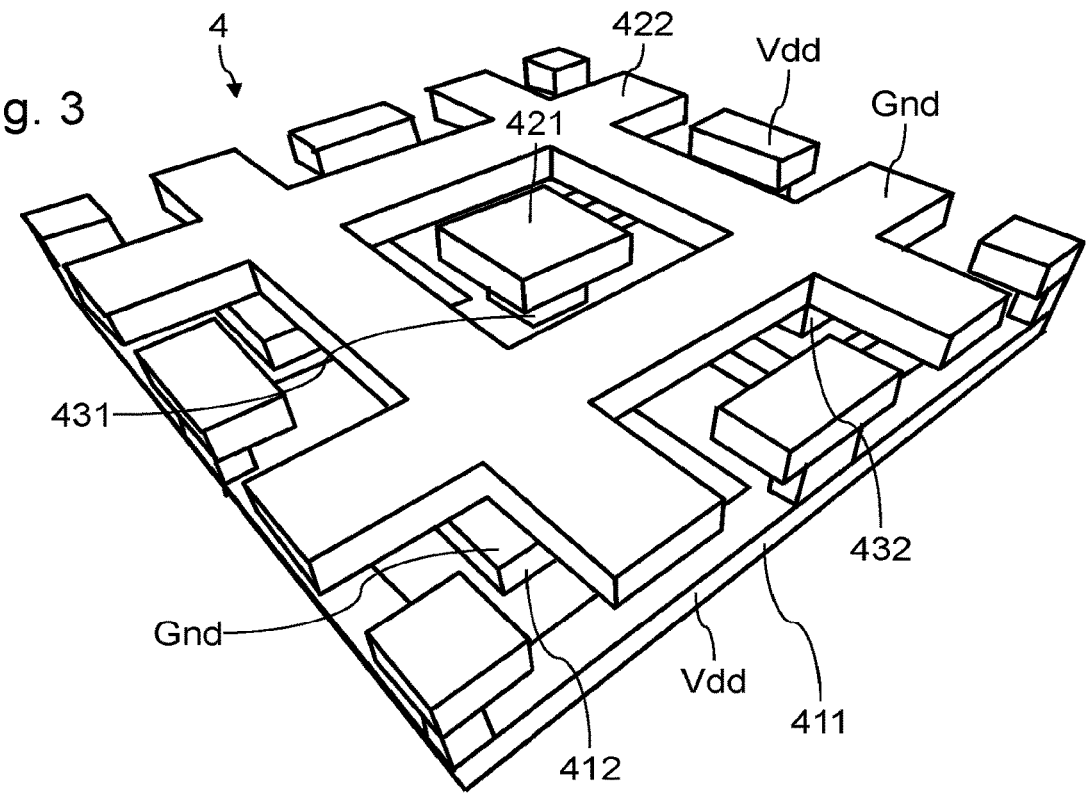
FIG. 3 is a perspective view of another example of a power distribution network configuration that may be implemented.

FIG. 3 is a perspective view schematically illustrating a second example of an electrical power distribution network 4, which may be incorporated within the highest metallization levels of the chip 1. The network 4 is here intended to apply two different supply potentials, Gnd and Vdd. However, it is also possible to envisage a network 4 that is configured to apply a greater number of supply potentials.

The power distribution network 4 includes two superposed metallization levels. A first metallization level of the network 4 includes a pattern of interconnected and intersecting parallel power distribution rails or conductive lines 411, as well as power distribution pads 412. The pattern of the lines 411 is electrically isolated from the pads 412. The pattern of the lines 411 and the pads 412 are biased to Vdd and Gnd, respectively.

A second metallization level of the network 4 includes a pattern of interconnected and intersecting parallel power distribution rails or conductive lines 422, as well as power distribution pads 421. The pattern of the lines 422 is electrically isolated from the pads 421. The pattern of the lines 422 and the pads 421 are biased to Gnd and Vdd, respectively.

The pattern of the lines 422 is electrically isolated from the pattern of the lines 411, and the pads 421 are electrically isolated from the pads 412.

The pattern of the lines 411 is electrically connected to the pads 421 by vias 431. The pattern of the lines 422 is electrically connected to the pads 421 by vias 432.

FIG. 4 is a schematic sectional view of one example of a conditioned three-dimensional integrated circuit according to one variant of the invention. In this variant, the conditioning includes a substrate 93, an encapsulation package 92 and a heatsink radiator 91. The assembly of the chips 1 and 2 is placed in the encapsulation package 92 and attached to the substrate 93.

The substrate 93 includes conductive bumps 94, making contact with contacts 102 that are formed on an outer face of the substrate 100. These contacts are connected to vias 103 termed TSVs, which pass through the substrate 100 and the layer 101. The vias 103 are connected to the power distribution network and/or to the interconnect network 3 via the assembly of metal interconnect layers 11.

FIG. 5 is a schematic sectional view of one example of a conditioned three-dimensional integrated circuit according to another variant of the invention. In this variant, the conditioning also includes a substrate 93, an encapsulation package 92 and a heatsink radiator 91. The assembly of the chips 1 and 2 is placed in the encapsulation package 92 and attached to the substrate 93.

A rear face of the substrate 100 is pressed against the substrate 93. The substrate 93 includes conductive pads 95. The pads 95 are electrically connected to the power distribution network and/or to the interconnect network 3 via conductive wires 96 (referred to as wire bonding).

FIG. 6 is a schematic sectional view of one example of an interconnect configuration for a three-dimensional circuit 9 according to the invention. The circuit 9 comprises two superposed chips 1 and 2, positioned face-to-face. The highest level metallization layers of the chip 1 and of the chip 2 thus face one another. The integrated circuit 9 also includes a three-dimensional interconnect network 3, which is intended to electrically interconnect the chips 1 and 2. The three-dimensional interconnect network 3 is intended to form a hybrid connection between the chips 1 and 2.

The chip 1 includes the superposition:
of a substrate 100;
of an active layer 101;
of the interconnect layers or metallization layers 111 to 118.

The chip 2 includes the superposition:
of a substrate 200;
of an active layer 201;
of the interconnect layers or metallization layers 211 to 214.

The chip 1 here comprises logic cells 12, extending from the active layer 101 to the metallization layer 112. The chip 2 here comprises memory cells 22, extending from the active layer 201 to the metallization layer 214.

The input/output interface at the potentials Gnd and Vdd of the memory cells 22 is here directly connected to the power distribution network of the chip 1 (which network is formed by the layers 117 and 118) via the three-dimensional interconnect network 3, including two hybrid connection layers forming a hybrid connection.

Via the metallization layers 111 to 118 and the three-dimensional interconnect network 3, the signal interfaces of the memory cells 22 are connected to the signal interfaces of the logic gates 12.

The invention claimed is:

1. An integrated circuit comprising:
a first chip including a stack comprising a substrate, an active layer, and interconnect layers;
a second chip including a stack comprising a substrate, an active layer, and interconnect layers, the interconnect layers of the first and second chips facing one another;
an interconnect network for interconnecting the first and second chips, which is connected directly to an interconnect layer of the highest metallization level of the first chip and connected directly to an interconnect layer of the highest metallization level of the second chip respectively, the interconnect network forming a hybrid connection layer between the first and second chips,
wherein:
the interconnect layer of the highest metallization level of the first chip includes a power distribution network;
the interconnect layer of the highest metallization level of the second chip is without a power distribution network.

2. The integrated circuit according to claim 1, wherein an etch pitch of the highest metallization level of the first chip is at least twice that of the highest metallization level of the second chip.

3. The integrated circuit according to claim 1, wherein a largest area of the first chip is occupied by logic gates, and wherein a largest area of the second chip is occupied by memory cells.

4. The integrated circuit according to claim 1, wherein an etch pitch of the interconnect network is at least eight times higher than an etch pitch of an interconnect layer of the lowest metallization level of the first chip.

5. The integrated circuit according to claim 1, wherein an etch pitch of the interconnect network is equal to an etch pitch of the interconnect layer of the highest metallization level of the first chip.

6. The integrated circuit according to claim 1, wherein the interconnect layer of the highest metallization level of the second chip is configured to route logic signals from electronic components of the second chip.

7. The integrated circuit according to claim 1, wherein an etch pitch of an interconnect layer of the lowest metallization level of the first chip is chosen from an group consisting of 65 nm, 40 nm, 32 nm, 28 nm, 22 nm, 20 nm, 14 nm, 10 nm and 7 nm.

8. A process for fabricating a three-dimensional integrated circuit, comprising:
providing a first chip including a stack comprising a substrate, an active layer, interconnect layers, and a hybrid connection layer that is directly connected to an interconnect layer of the highest metallization level of the first chip, the interconnect layer of the highest metallization level of the first chip includes a power distribution network;
providing a second chip including a stack comprising a substrate, an active layer, interconnect layers, and a hybrid connection layer that is directly connected to an interconnect layer of the highest metallization level of the second chip, the interconnect layer of the highest metallization level of the second chip is without a power distribution network;
placing the hybrid connection layers of the first and second chips so that they face one another;
forming a hybrid connection between the hybrid connection layers of the first and second chips so as to form an interconnect network for interconnecting the first and second chips.

9. The integrated circuit according to claim 1, wherein the interconnect network connects the interconnect layer of the highest metallization level of the first chip directly to the interconnect layer of the highest metallization level of the second chip, and
the substrate of the first chip and the substrate of the second chip are located at different respective ends of the integrated circuit.

10. The process according to claim 8, wherein the hybrid connection connects the interconnect layer of the highest metallization level of the first chip directly to the interconnect layer of the highest metallization level of the second chip, and
the placing is performed such that the substrate of the first chip and the substrate of the second chip are located at different respective ends of the integrated circuit.

11. The integrated circuit according to claim 1, further comprising a heatsink coupled to the second chip.

12. The process according to claim 8, further comprising providing a heatsink coupled to the second chip.

* * * * *